July 29, 1969 M. F. SLANA 3,458,718

LOGIC SYSTEM INCLUDING AN EMITTER-FOLLOWER AMPLIFIER HAVING A TWO-TERMINAL CURRENT-LIMITING DEVICE CONNECTED BETWEEN ITS EMITTER ELECTRODE AND A POINT OF REFERENCE POTENTIAL

Filed March 17, 1966

INVENTOR
M. F. SLANA
BY Lucian C. Canepa
ATTORNEY

United States Patent Office 3,458,718

Patented July 29, 1969

3,458,718

LOGIC SYSTEM INCLUDING AN EMITTER-FOLLOWER AMPLIFIER HAVING A TWO-TERMINAL CURRENT-LIMITING DEVICE CONNECTED BETWEEN ITS EMITTER ELECTRODE AND A POINT OF REFERENCE POTENTIAL

Matthew F. Slana, Millington, N.J., assignor to Bell Telephone Laboratories, Incorporated, New York, N.Y., a corporation of New York Filed Mar. 17, 1966, Ser. No. 535,163
Int. Cl. H03k *19/08*
U.S. Cl. 307—203 2 Claims

ABSTRACT OF THE DISCLOSURE

In a transistor resistor logic system, a driving emitter-follower amplifier is coupled to a plurality of driven logic circuits each of which is also driven by at least one other driving circuit. A two-terminal current-limiting device is connected between the emitter electrode of the driving amplifier and a point of reference potential. The device exhibits a relatively low-impedance characteristic when the amplifier is in its nonconducting state and a relatively high-impedance constant-current characteristic when the amplifier is in its conducting state. Accordingly, when the emitter-follower amplifier is in its nonconducting state, the voltage drop across the device is maintained below a prescribed maximum whereby the immunity of the system to spurious noise impulses is high. On the other hand, when the emitter-follower amplifier is in its conducting state, the current drain imposed on the collector bias source of the amplifier is established at a relatively low value.

Figures 1, 2:
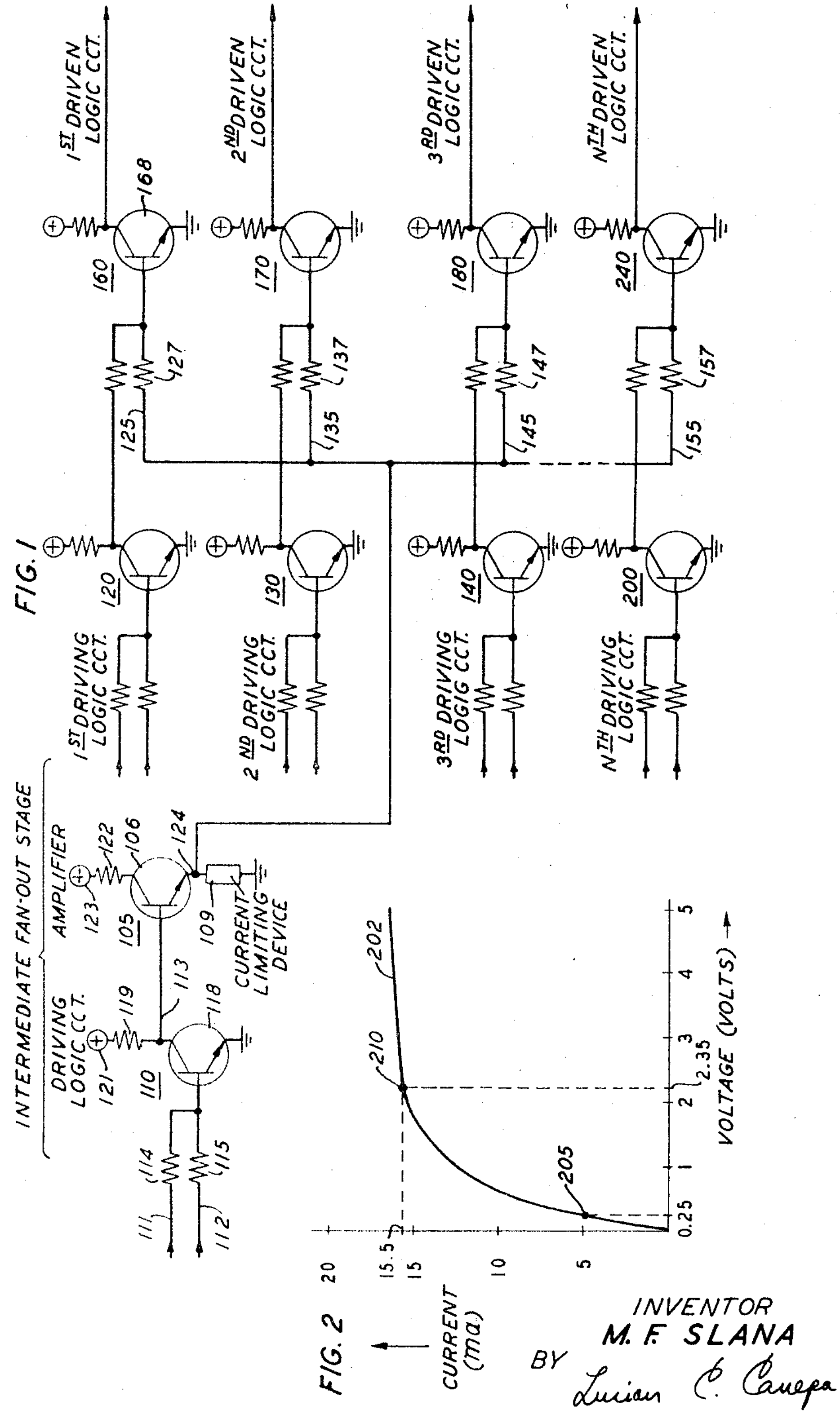

This invention relates to the processing of digital information and more particularly to transistor resistor logic systems.

Typical of the logic technologies from which the circuitry of a digital information processing system may be constructed is that designated transistor resistor logic or TRL which comprises a basic logic circuit or building block including a transistor and a plurality of resistors.

One conventional TRL system as constructed heretofore comprises an intermediate-fan-out stage including an emitter-follower amplifier that drives a plurality of TRL logic circuits each of which is also driven by at least one driving TRL logic circuit. For proper operation of the system, it is required that the voltage with respect to ground of the emitter electrode of the emitter-follower amplifier not exceed a predetermined voltage level when the emitter follower is in its nonconducting or "0" state. In effect this requirement specifies the maximum ohmic value that may be chosen for the noted emitter resistor. Ideally, the voltage with respect to ground of the emitter electrode should be zero volts when the emitter follower is in its "0" state. This dictates that the emitter resistor be relatively low in value.

When the emitter-follower amplifier is switched to its "1" state, the amplifier must supply current to the driven TRL logic circuits and, in addition, must supply current through the aforementioned low-valued emitter resistor. This imposes a substantial current drain on the power supply of the amplifier. Ideally, the emitter resistor should require zero current therethrough when the emitter follower is in its "1" state. Of course, this requirement dictates that the emitter resistor be relatively high in ohmic value.

In practice, the above-mentioned competing considerations relative to selection of the ohmic value of the specified emitter resistor are resolved by choosing therefor the highest-valued resistor that will provide satisfactory operating margins when the emitter-follower amplifier is in its "0" state. The penalty associated with this approach is that appreciable current drain and power dissipation occur in the system when the emitter follower is in its "1" state.

Accordingly, an object of the present invention is the improvement of logic systems.

More specifically, an object of this invention is an imroved TRL system which comprises a driving emitter-follower amplifier modified to consume a relatively small amount of power when in the "1" state while still providing satisfactory operating margins when in the "0" state.

Another object of the present invention is a TRL logic system characterized by reliability, simplicity, high speed and improved short-circuit protection.

These and other objects of the present invention are realized in a specific illustrative embodiment thereof which includes a driving emitter-follower amplifier that is coupled to a plurality of driven logic circuits each of which is also driven by at least one other driving circuit. In accordance with the invention the usual emitter resistor included in the emitter-follow amplifier is replaced with a two-terminal current-limiting device whose voltage-current characteristic simulates the above-mentioned ideal switching function more closely than a resistor does. When the emitter-follower amplifier is in its de-energized condition, the noted device exhibits a relatively low ohmic value, whereby the voltage drop thereacross is maintained below a prescribed maximum and the susceptibility of the system to spurious noise impulses is not degraded. On the other hand, when the amplifier is in its energized condition, the device exhibits a relatively high ohmic value and a constant-current characteristic, whereby the current drain imposed on the collector bias source of the amplifier is then significantly less than if a conventional linear resistive element were employed as the emitter load.

Thus, a TRL system made in accordance with the principles of the present invention consumes less total power in its overall mode of operation than do conventional systems of the same general type. Lower total power consumption leads to lower average operating temperatures which, in turn, tend to make such systems more feasible for miniaturization in compact assemblies.

Additionally, as will be apparent from the detailed description hereinbelow, the collector resistor of an emitter-follower amplifier made in accordance with the principles of the present invention is typically greater in ohmic value than the corresponding resistor of a conventional such amplifier. As a result, the improved amplifier exhibits better short-circuit protection (of its emitter circuit) than does its known counterpart.

It is a feature of the present invention that a TRL system include a driving emitter-follower amplifier whose emitter resistor is replaced by a two-terminal current-limiting device whose voltage-current characteristic simulates the aforementioned ideal switching function more closely than the replaced resistor does.

It is another feature of this invention that the emitter electrode of the emitter-follower amplifier be connected to a plurality of driven TRL logic circuits each of which is driven by at least one other driving circuit, and that the noted current-limiting device exhibit a relatively low ohmic value when the emitter-follower amplifier is de-energized and a relatively high ohmic value when the amplifier is energized to drive the specified logic circuits.

A complete understanding of the above and other objects, features and advantages of the present invention may be gained from a consideration of the following detailed description of a specific illustrative embodiment thereof presented hereinbelow in connection with the accompanying drawing, in which:

FIG. 1 is a circuit diagram of a specific illustrative TRL system made in accordance with the principles of the present invention; and FIG. 2 shows the voltage-current characteristic curve of one particular current-limiting device adapted to be included in the FIG. 1 system.

The TRL system shown in FIG. 1 includes an emitter-follower amplifier 105 and a plurality of identical logic circuits 110, 120, 130, 140 . . . 200, 160, 170, 180 . . . 240. The logic circuit 110, for example, includes two leads 111 and 112 to which may be applied input signals, whereby there is produced on a lead 113 an output signal that is a logical function of the input signals. The circuit 110 also includes input resistors 114 and 115, an NPN transistor 118, a collector bias resistor 119 and a positive source 121 of direct-current power.

If a voltage at or near ground potential (illustratively, less than 0.27 volt) is assumed to represent the binary value "0" and if a relatively high voltage (illustratively, greater than or equal to 2.35 volts) is designated "1," the logic circuit 110 performs the function of providing on the lead 113 a "0" signal if a "1" signal is applied to one or both of the input leads 111 and 112. On the other hand, a "1" signal appears on the output lead 113 only if each of the input leads 111 and 112 has a "0" signal applied thereto. Such a configuration is the basic TRL building block and is commonly referred to as a NOT-OR or NOR logic circuit.

Whenever a relatively large number of logic circuits is to be controlled by the logic circuit 110, it is necessary, in order to ensure sufficient drive to and proper operation of the controlled or driven circuits, that an amplifier be interposed between the driving and driven circuits. Thus, as shown in FIG. 1, the amplifier 105 is interposed between the driving logic circuit 110 and the plurality of driven logic circuits 160, 170, 180 . . . 240.

It is noted that the term fan-out is commonly employed to specify the number of logic circuits driven by a driving circuia and that the term fan-in is commonly employed to specify the number of inputs to a given circuit. Thus, for example, to indicate that a driving circuit has a fan-out of say five is to specify that the circuit is coupled to five driven circuits. In accordance with this terminology and based on the assumption that the amplifier 105 is coupled to an intermediate number of driven logic circuits 160, 170, 180 . . . 240 (illustratively, less than or equal to ten such circuits) the combination of the driving logic circuit 110 and the amplifier 105 may be termed an intermediate-fan-out stage and is so designated in FIG. 1.

The emitter-follower amplifier 105 includes an NPN transistor 106 whose base electrode is directly connected to the output lead 113 of the driving logic circuit 110. The amplifier 105 also comprises a collector bias resistor 122, a positive source 123 of direct-current power and an output terminal 124. Connected between the terminal 124 and a point of reference potential such as ground is a current-limiting device 109. The specific nature and function of the device 109 will be described below.

Whenever the transistor 118 of the driving logic circuit 110 is in its conducting condition, the potential of the output lead 113 with respect to ground is relatively low (less than 0.27 volt, which is the collector-to-emitter voltage drop of the transistor 118). As specified above, this low potential is indicative of a "0" signal. Such a "0" signal is insufficient to turn on the transistor 106 of the emitter-follower amplifier 105, whereby the potential with respect to ground of the output terminal 124 is also low, indicative of a "0" output signal.

On the other hand, whenever the transistor 118 of the driving logic circuit 110 is in its nonconducting condition, the potential with respect to ground of the output lead 113 is a relatively high positive voltage representative of a "1" signal. In that case, the source 121 and the resistor 119 provide sufficient base drive to the transistor 106 to switch it to its conducting state, whereby a current flows through the current-limiting device 109 to make the amplifier output terminal 124 sufficiently positive with respect to ground to represent a "1" signal and to drive all of the logic circuits 160, 170, 180 . . . 240 into conduction.

Connected to the output terminal 124 of the emitter-follower amplifier 105 of the intermediate-fan-out stage shown in FIG. 1 are a plurality of output paths 125, 135, 145 . . . 155. Each of these paths extends through a respective associated resistor to the base or input electrode of a different one of the driven logic circuits 160, 170, 180 . . . 240. Thus, for example, the output path 125 is connected via a resistor 127 to the base electrode of a transistor 168 of the first driven logic circuit 160.

Also coupled to the input of the first driven logic circuit 160 is the first driving logic circuit 120. Similarly the driven logic circuits 170, 180 . . . 240 are respectively driven by the logic circuit 130, 140 . . . 200.

To facilitate an understanding of the unique operation of the specific illustrative embodiment shown in FIG. 1, assume for initial purposes of discussion that a resistor instead of the current-limiting device 109 is connected between the output terminal 124 and ground. Assume further that the emitter-follower amplifier 105 is de-energized and that all but the topmost one of the driven logic circuits are energized by their respective driving circuits 130, 140 . . . 200. In this case, each of the base electrodes of the driven circuits 170, 180 . . . 240 is at a positive potential, say 0.7 volt with respect to ground. As a result thereof, a current flows from right-to-left through each of the input resistors 137, 147 . . . 157 of the energized circuits 170, 180 . . . 240 to the terminal 124 and through the assumed resistor to ground. In one practical system as heretofore constructed, the total current flow through this resistor approximates five milliamperes. To ensure satisfactory noise margins in such a system, it is required that the potential with respect to ground of the terminal 124 be less than about 0.27 volt when the amplifier 105 is de-energized. This requirement dictates that the assumed emitter resistor not exceed a value of about 50 ohms.

If, in the circumstances assumed above, the voltage of the output terminal 124 exceeded 0.27 volt, the susceptibility of the topmost driven logic circuit 160 to being turned on by spurious noise impulses coupled to the leads that extend between the terminal 124 and the base electrode of the transistor 168, would be undesirably high. Such an excessive voltage at the terminal 124 might cause the circuit 160 to become energized at a time when proper system operation required that it remain in its non-conducting condition.

Considering further the situation in which a conventional resistor is connected between the output terminal 124 and ground, assume now that the amplifier 105 is switched to its conducting condition. In that condition, current must be supplied from the output terminal 124 of the amplifier 105 to drive the logic circuits 160, 170, 180 . . . 240. The total driving current so required may approximate 15 milliamperes. In addition, the amplifier 105 must supply the current that flows through the emitter resistor thereof. To minimize the current drain imposed on the collector bias source 123, the value of this resistor should advantageously be relatively high (greater than 50 ohms). Ideally, no current should be drawn by the emitter resistor during the time in which the amplifier 105 is energized. However, assuming that the terminal 124 must under these circumstances attain a driving potential of about 2.35 volts, almost 50 milliamperes would actually flow through the above-assumed 50-ohm emitter resistor. This substantial current flow therethrough represents wasted power and, together with the aforementioned 15 milliamperes of driving current, imposes a total drain of about 65 milliamperes on the source 123.

In accordance with the principles of the present invention the assumed emitter resistor of the amplifier 105 is replaced by a current-limiting device, as indicated in FIG. 1. Advantageously the device 109 is of the high-speed type described in Engineering Services on Transistors, Report No. 20, 8th Quarterly Progress Report, June 30, 1965, in an article on pages 35–42, entitled "High-Speed Current Limiters" by H. J. Boll, J. E. Iwersen, and E. W. Perry, Contract DA 36–039 AMC–02227(E), prepared by Bell Telephone Laboratories, Incorporated, on behalf of Western Electric Company, Incorporated. The voltage-current characteristic of such a device is illustrated by the curve 202 shown in FIG. 2.

The characteristic curve 202 shown in FIG. 2 includes two points 205 and 210 respectively representative of the operating condition of the current-limiting device 109 during the de-energized and energized states of the emitter-follower amplifier 105. In particular, the point 205 indicates the operating point of the device 109 when the amplifier 105 is de-energized and the maximum possible current flows through the device 109 via the resistors 127, 137, 147 . . . 157. This maximum current approximates five milliamperes. From FIG. 2 it is apparent that the corresponding voltage value on the curve 202 at the point 205 is 0.25 volt. As indicated above, this voltage value is sufficiently low to ensure that the TRL system depicted in FIG. 1 exhibits good noise margins. In this operating mode the device 109 simulates an emitter load of about 50 ohms.

The parameters of the emitter-follower amplifier 105 are selected such that when the transistor 106 is switched to its conducting or relatively low impedance state, the operating point of the device 109 is represented by the aforementioned point 270. The voltage value corresponding to the point 210 is about 2.35 volts, which is sufficient to drive the logic circuits 160, 170, 180 . . . 240 in the intended manner. The current value corresponding to the point 210 is seen from FIG. 2 to be 15.5 milliamperes. In effect, this means that in this operating mode the device 109 constitutes an emitter load of about 150 ohms.

In its energized condition, the emitter-follower amplifier 105 may be required to supply about 1.5 milliamperes to each of the driven TRL logic circuits 160, 170, 180 . . . 240. Assuming a fan-out of ten, the total current that flows from the output terminal 124 via the paths 125, 135, 145 . . . 155 to these driven circuits is thus about 15 milliamperes. Adding to this the 15.5 milliamperes that flow through the device 109, it is evident that the total drain imposed on the source 123 is only about 30 milliamperes. By contrast, and as indicated above in connection with the description of a standard TRL system, approximately 65 milliamperes are drawn from the source 123 when a conventional 50-ohm resistor constitutes the emitter load of the amplifier 105.

Additionally, the novel circuit shown in FIG. 1, exhibits an improved short-circuit protection characteristic. This feature stems from the fact that the value of the collector resistor 122 of FIG. 1 is typically about twice what it would be if the current-limiting device 109 were replaced by a standard 50-ohm resistor. For that reason, any inadvertent shorting to ground of the output terminal 124 of the depicted circuit is less likely to damage the transistor 106 and its associated circuitry.

Thus, there has been described herein a specific illustrative emodiment of an improved TRL system. In one mode of operation the improved system is characterized by the same good noise margins exhibited by standard such systems. However, in a second mode of operation, the improved system is characterized by lower power consumption and better short-circuit protection than its standard counterpart.

It is to be understood that the above-described arrangement is only illustrative of the application of the principles of the present invention. In accordance with these principles numerous other arrangements may be devised by those skilled in the art without departing from the spirit and scope of this invention. For example, although particular emphasis herein has been directed to one specific high-speed current limiter as being advantageous for inclusion in the improved TRL system, it is to be understood that any available current-limiting device having a characteristic of the general type shown in FIG. 2 may be utilized for the device 109. Of course, the overall operating properties of the depicted system can be further improved if the constant-current portion of the FIG. 2 characteristic is adjusted to occur at a lower current value.

What is claimed is:

1. In combination in a logic system, a plurality of driven logic circuits, a driving amplifier having an output terminal, means coupling said output terminal to each of said plurality of circuits, at least one driving logic circuit respectively coupled to each of said plurality of driven circuits, and a two-terminal current-limiting device connected between said terminal and a point of reference potential for exhibiting a relatively low impedance characteristic when said amplifier is in its nonconducting state and a relatively high impedance constant-current characteristic when said amplifier is in its conducting state.

2. A system as in claim 1 wherein each of said logic circuits is of the transistor-resistor type and wherein said amplifier is of the emitter-follower type.

References Cited

UNITED STATES PATENTS

| | | | |
|---|---|---|---|
| 3,048,716 | 8/1962 | Seley et al. | 307—215 |
| 3,090,926 | 5/1963 | Engel | 307—206 |
| 3,192,396 | 6/1965 | Hasdorff | 307—215 |
| 3,235,754 | 2/1966 | Buelow et al. | 307—215 X |
| 3,249,765 | 5/1966 | Miller | 307—206 |

DONALD D. FORRER, Primary Examiner

U.S. Cl. X.R.

307—215, 237, 317